(12) United States Patent
Nishida et al.

(10) Patent No.: US 9,711,430 B2
(45) Date of Patent: Jul. 18, 2017

(54) SEMICONDUCTOR DEVICE, METHOD FOR INSTALLING HEAT DISSIPATION MEMBER TO SEMICONDUCTOR DEVICE, AND A METHOD FOR PRODUCING SEMICONDUCTOR DEVICE

(71) Applicant: FUJI ELECTRIC CO., LTD., Kawasaki-shi (JP)

(72) Inventors: Yuhei Nishida, Matsumoto (JP); Tatsuo Nishizawa, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/483,776

(22) Filed: Sep. 11, 2014

(65) Prior Publication Data
US 2014/0374896 A1 Dec. 25, 2014

Related U.S. Application Data

(63) Continuation of application No. PCT/JP2013/071785, filed on Aug. 12, 2013.

(30) Foreign Application Priority Data

Sep. 13, 2012 (JP) ................................ 2012-201775

(51) Int. Cl.
*H01L 23/40* (2006.01)
*H01L 21/48* (2006.01)
(Continued)

(52) U.S. Cl.
CPC ...... *H01L 23/4006* (2013.01); *H01L 21/4882* (2013.01); *H01L 21/56* (2013.01);
(Continued)

(58) Field of Classification Search
None
See application file for complete search history.

(56) References Cited

U.S. PATENT DOCUMENTS 4,100,566 A * 7/1978 Okikawa ............. H01L 23/3107
257/675
5,172,755 A 12/1992 Samarov
(Continued)

FOREIGN PATENT DOCUMENTS

DE 4338107 C1 3/1995
EP 2854174 A1 4/2015
(Continued)

OTHER PUBLICATIONS

International Search Report dated Oct. 15, 2013 issued in corresponding International Application No. PCT/JP2013/071785. English translation provided.
(Continued)

*Primary Examiner* — William Coleman
*Assistant Examiner* — Kien Ly
(74) *Attorney, Agent, or Firm* — Rossi, Kimms & McDowell LLP

(57) ABSTRACT

A semiconductor device is fastened to a heat dissipation member such that a force directed downward acts from a metal substrate onto the heat dissipation member, with a rim portion of a storage region as a fulcrum with respect to the heat dissipation member. As a result, a heat conductive material can be spread into a thinner layer between the metal substrate and the heat dissipation member, improving the heat dissipation between the metal substrate and the heat dissipation member.

20 Claims, 5 Drawing Sheets

(51) Int. Cl.
  *H01L 21/56* (2006.01)
  *H01L 23/31* (2006.01)
  *H01L 23/13* (2006.01)
  *H01L 23/36* (2006.01)
  *H01L 23/373* (2006.01)
  H01L 23/049 (2006.01)
  H01L 23/498 (2006.01)
  H01L 25/07 (2006.01)
  H01L 23/00 (2006.01)

(52) U.S. Cl.
  CPC .......... *H01L 23/13* (2013.01); *H01L 23/3121* (2013.01); *H01L 23/36* (2013.01); *H01L 23/3735* (2013.01); H01L 23/049 (2013.01); H01L 23/49811 (2013.01); H01L 24/45 (2013.01); H01L 25/072 (2013.01); H01L 2224/45124 (2013.01); H01L 2224/48137 (2013.01); H01L 2224/48227 (2013.01); H01L 2924/19107 (2013.01); H01L 2924/3511 (2013.01)

(56) References Cited

U.S. PATENT DOCUMENTS

| | | | |
|---|---|---|---|
| 5,379,942 A | 1/1995 | Kuhnert et al. | |
| 5,508,560 A | 4/1996 | Koehler et al. | |
| 5,686,758 A * | 11/1997 | Arai | H01L 25/18 257/668 |
| 5,793,106 A * | 8/1998 | Yasukawa | H01L 23/3121 257/706 |
| 9,236,324 B2 * | 1/2016 | Besshi | H01L 23/3107 |
| 2003/0094682 A1 * | 5/2003 | Shinohara | H01L 23/13 257/685 |
| 2003/0102553 A1 * | 6/2003 | Ishikawa | H01L 23/3735 257/707 |
| 2004/0095730 A1 | 5/2004 | Youm et al. | |
| 2008/0164610 A1 * | 7/2008 | Fan | H01L 23/13 257/738 |
| 2008/0284007 A1 * | 11/2008 | Horio | H01L 25/072 257/734 |
| 2009/0039498 A1 * | 2/2009 | Bayerer | H01L 24/34 257/700 |
| 2009/0261472 A1 * | 10/2009 | Bayerer | H01L 24/06 257/719 |
| 2010/0065962 A1 * | 3/2010 | Bayerer | H01L 23/3735 257/703 |
| 2010/0302741 A1 * | 12/2010 | Kanschat | H01L 23/24 361/717 |
| 2015/0116945 A1 | 4/2015 | Minamio | |

FOREIGN PATENT DOCUMENTS

| | | | |
|---|---|---|---|
| JP | 04096355 A | | 3/1992 |
| JP | 07169781 A | | 7/1995 |
| JP | 07273257 A | | 10/1995 |
| JP | 09045851 A | | 2/1997 |
| JP | 10340975 A | * | 12/1998 |
| JP | 11177002 A | | 7/1999 |
| JP | 2000-058727 A | | 2/2000 |
| JP | 2003-303933 A | | 10/2003 |
| JP | 2003324171 A | | 11/2003 |
| JP | 2004165626 A | | 6/2004 |
| JP | 2004363521 A | | 12/2004 |
| JP | 2006080153 A | | 3/2006 |
| JP | 2009044152 A | | 2/2009 |
| WO | 2013175714 A1 | | 11/2013 |

OTHER PUBLICATIONS

Extended European Search Report issued in EP13837550.6, mailed Sep. 30, 2015.

* cited by examiner

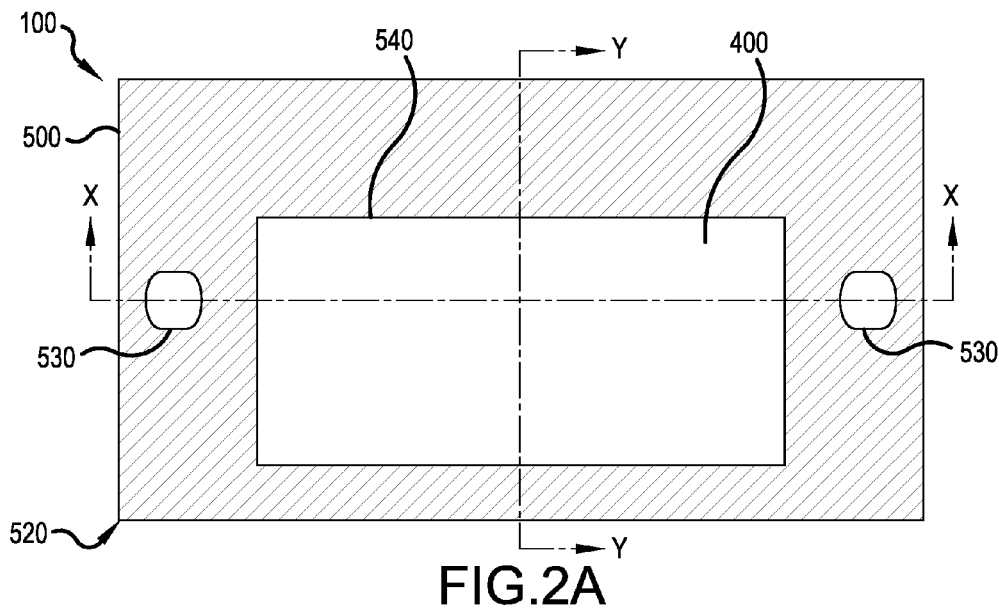
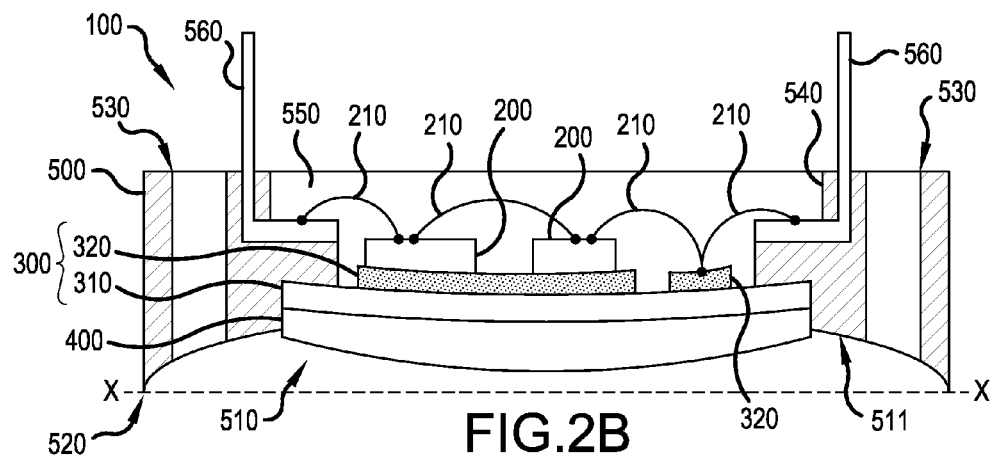
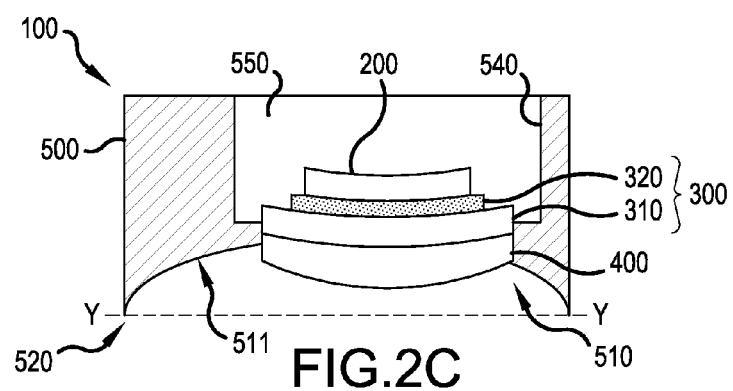

… (US 9,711,430 B2)

SEMICONDUCTOR DEVICE, METHOD FOR INSTALLING HEAT DISSIPATION MEMBER TO SEMICONDUCTOR DEVICE, AND A METHOD FOR PRODUCING SEMICONDUCTOR DEVICE

CROSS-REFERENCE TO RELATED APPLICATIONS

This application is a continuation of International Application No. PCT/JP2013/071785, filed on Aug. 12, 2013, and is based on and claims priority to Japanese Patent Application No. JP 2012-201775, filed on Sep. 13, 2012. The disclosure of the Japanese priority application and the PCT application in their entirety, including the drawings, claims, and the specification thereof, are incorporated herein by reference.

BACKGROUND

Field of the Invention

Embodiments of the present invention relate to a semiconductor device, a method for installing a heat dissipation member to the semiconductor device, and a method for producing the semiconductor device.

Discussion of the Background

A semiconductor module (semiconductor device) such as a power conversion element mounted with a power semiconductor chip has a heat dissipation member such as a heat dissipation fin placed on a metal substrate of the semiconductor module, so that heat generated from the semiconductor chip is released by the heat dissipation member (see Japanese Patent Application Publication No. 2004-363521 ("Patent Document 1"), for example). Such a configuration can prevent the increase of the temperature of the semiconductor module.

A heat conductive material such as heat conductive grease is applied to the heat dissipation fin or the metal substrate of the semiconductor module prior to placing the heat dissipation fin on the semiconductor module. The heat conductive material is composed of an organic substance, and heat dissipation of the heat conductive material weakens as the coating thickness of the material becomes excessive. For this reason, the heat conductive material needs to be applied in a layer as thin as possible. By fastening the heat dissipation fin to the metal substrate of the semiconductor module with a screw or the like after the application of the heat conductive material, a force to reduce the thickness of the heat conductive material can be generated at the center of the heat dissipation fin immediately below the semiconductor element. As a result, the distance between the metal substrate and the heat dissipation fin decreases, thereby spreading the heat conductive material into a thin layer, further improving the ability to release heat generated from the semiconductor element (see Japanese Patent Application Publication No. 2000-058727 ("Patent Document 2"), for example).

In addition to using the technology disclosed in Patent Document 2 in which the thickness of the heat conductive material is reduced by changing the shape of the metal substrate (metal base) in the thickness direction, application of a heat conductive material is possible by controlling the shape and thickness of a metal substrate using a metal mask.

Patent Document 2, however, needs to form projections, mounting holes, and the like on the metal base in order to change the shape of the metal base in the thickness direction, and needs to prepare a mask even when using a metal mask. Forming projections, mounting holes and the like and preparing a mask as described above involve a lot of effort, and thus lead to an increase in production cost.

SUMMARY

Embodiments of the present invention provide a semiconductor device having a configuration different from those described in the foregoing patent documents and thus having improved heat dissipation, a method for installing a heat dissipation member to such a semiconductor device, and a method for producing such a semiconductor device.

An embodiment of the present invention provides a semiconductor device which has a semiconductor element and on which a heat dissipation member is to be placed, the semiconductor device comprising: a circuit board having the semiconductor element placed on one of principal surfaces thereof; a metal substrate placed on the other principal surface of the circuit board; and a storage member that has a storage region having a concave principal surface and an opening which is disposed on the inside of the concave principal surface to store the circuit board therein with the metal substrate protruding from the concave principal surface, and screw holes that are opened in the concave principal surface to allow passage of screw members that are screwed to the heat dissipation member which is placed in such a manner as to face the metal substrate of the stored circuit board with a heat conductive material therebetween.

An embodiment of the present invention provides a method for installing a heat dissipation member to such a semiconductor device, and a method for producing such a semiconductor device.

According to this semiconductor device, the method for installing a heat dissipation member to the semiconductor device, and the method for producing the semiconductor device, heat dissipation of the semiconductor device can be improved.

The above and other objects, features, and advantages of the present invention will become apparent from the following description associated with the accompanying drawings which illustrate the embodiments preferred as examples of the present invention.

BRIEF DESCRIPTION OF THE DRAWINGS

FIGS. 2A, 2B, and 2C are diagrams for explaining a semiconductor device according to a second embodiment.

DESCRIPTION OF ILLUSTRATED EMBODIMENTS

Figure 1A:
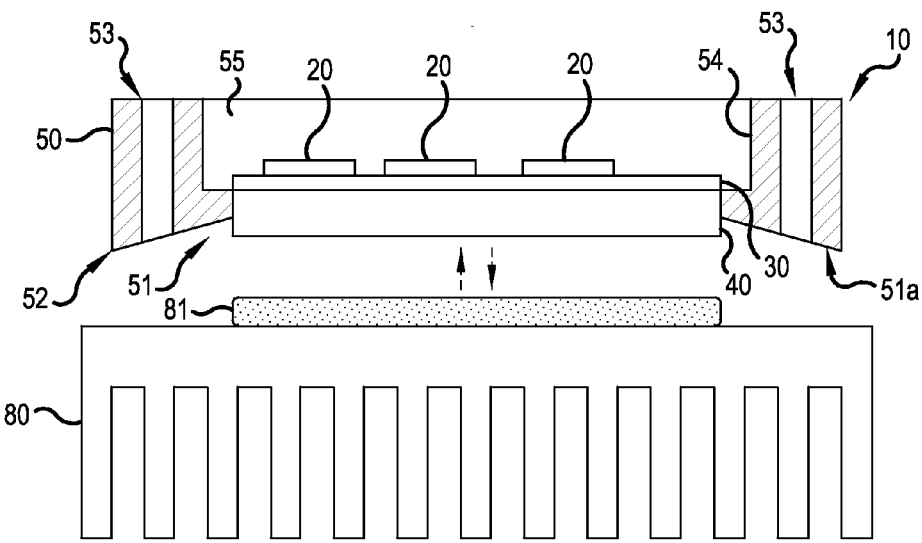
FIGS. 1A, 1B, and 1C are diagrams for explaining a semiconductor device according to a first embodiment and a method for installing a heat dissipation member to the semiconductor device.

Embodiments of the present invention are now described hereinafter with reference to the drawings.

First Embodiment

FIG. 1 is a diagram for explaining a semiconductor device according to a first embodiment and a method for installing a heat dissipation member to the semiconductor device.

A semiconductor device 10 has a semiconductor element 20. The semiconductor device 10 is placed on a heat dissipation member 80 and used. When placing the semiconductor device 10 on the heat dissipation member 80, a heat conductive material 81 is spread evenly into a thin layer between a metal substrate 40 below the semiconductor element 20 and the heat dissipation member 80. Owing to such a configuration of the semiconductor device 10, heat of the semiconductor element 20 can be transmitted from the metal substrate 40 to the heat dissipation member 80, improving the thermal conductivity of the semiconductor device 10.

As shown in FIG. 1A, this semiconductor device 10 has a circuit board 30 having the semiconductor element 20 placed on one of its principal surfaces, and the metal substrate 40 placed on the other principal surface of the circuit board 30.

The semiconductor device 10 also has a storage member 50 for accommodating the circuit board 30. The storage member 50 is a frame-like (O-shaped) or rim-like member and has a storage region 51 having a concave principal surface 51a (the lower side of the diagram) and an opening 54 disposed on the inside of this concave principal surface 51a. The storage member 50 further has screw holes 53 passing between the concave principal surface 51a and a principal surface facing the principal surface 51a (the upper side of the diagram). The circuit board 30 is stored in the opening 54, with the metal substrate 40 protruding from the concave principal surface 51a. Screw members 70 (described hereinafter) are inserted into the screw holes 53 and screwed to the heat dissipation member 80 that is placed facing the metal substrate 40 of the stored circuit board 30 with the heat conductive material 81 therebetween. The concave principal surface 51a is configured by a flat surface or a curved surface that is inclined with respect to the principal surface facing the principal surface 51a (the upper side of the diagram), and is formed in such a manner that a rim portion 52 disposed outside the screw holes 53 in the storage region 51 protrudes toward the heat dissipation member 80. The screw holes 53 are formed, with the axes thereof situated substantially perpendicular to the upper surface of the storage member 50. Note that the circuit board 30, which is stored in the storage region 51 of the storage member 50, is sealed together with the semiconductor element 20 with resin 55.

Next is described a method for installing the semiconductor device 10 of such a configuration to the heat dissipation member 80. First, a predetermined amount of the heat conductive material 81 is disposed in a region of the heat dissipation member 80 with which the metal substrate 40 comes into contact (FIG. 1A). Note that the heat conductive material 81 may be disposed in the region near the metal substrate 40. The heat conductive material 81 is heat conductive grease (a thermal compound) or the like that is generally used.

Figure 1B:
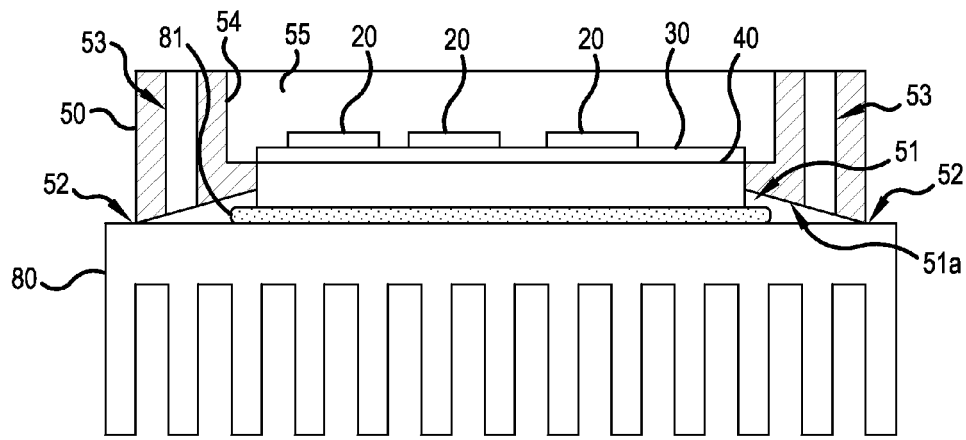

The heat dissipation member 80 with the heat conductive material 81 and the semiconductor device 10 are then fixed to each other. In so doing, the heat dissipation member 80 is supported by the rim portion 52 of the storage region 51 of the storage member 50 of the semiconductor device 10. The heat conductive material 81 is spread between the heat dissipation member 80 and the metal substrate 40 of the semiconductor device 10 (FIG. 1B).

Figure 1C:
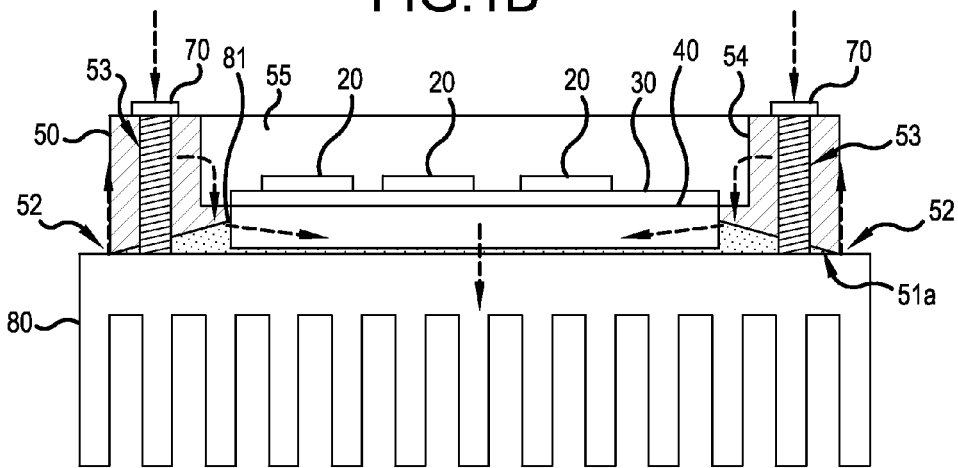

The screw members 70 are inserted into the screw holes 53 of the storage member 50 of the semiconductor device 10 and screwed to the heat dissipation member 80, to fasten the semiconductor device 10 to the heat dissipation member 80 (FIG. 1C).

In the semiconductor device 10 at this moment, a force is applied to the center of the metal substrate 40, with the rim portion 52 of the storage region 51 as a fulcrum with respect to the heat dissipation member 80, and a force that is directed downward in the diagram acts from the metal substrate 40 onto the heat dissipation member 80. The heat conductive material 81 can be spread into a thin layer as the distance between the metal substrate 40 and the heat dissipation member 80 decreases as described above. As a result, heat dissipation between the metal substrate 40 and the heat dissipation member 80 improves. Moreover, the heat conductive material 81 spreads outside the metal substrate 40 and fills the periphery of the metal substrate 40. This leads to an increase in air tightness of the periphery of the metal substrate 40, inhibiting bubbles and the like from being mixed therein and preventing the deterioration of the heat dissipation.

The semiconductor device 10 described above has the semiconductor element 20, the circuit board 30 having the semiconductor element 20 placed on one of its principal surfaces, the metal substrate 40 placed on the other principal surface of the circuit board 30, and the storage member 50 that has the storage region 51 in which the principal surface 51a thereof configures a concave opening, and the screw holes 53. In the semiconductor device 10, the circuit board 30 is stored in the storage region 51 of the storage member 50, with the metal substrate 40 protruding from the concave principal surface 51a, and the stored circuit board 30 is sealed together with the semiconductor element 20 with the resin 55. The metal substrate 40 and the heat dissipation member 80 are fixed to each other by the heat conductive material 81 therebetween, and the screw members 70 are inserted into the screw holes 53 of the storage member 50 and screwed to the heat dissipation member 80, to fasten the semiconductor device 10 to the heat dissipation member 80.

By fastening the semiconductor device 10 to the heat dissipation member 80 as described above, a force from the storage member 50 is applied to the center of the metal substrate 40 in the semiconductor device 10, with the rim portion 52 of the storage region 51 as a fulcrum, and a force that is directed downward in the diagram acts from the metal substrate 40 onto the heat dissipation member 80. As a result, the heat conductive material 81 can be spread into a thin layer between the metal substrate 40 and the heat dissipation member 80, improving the heat dissipation between the metal substrate 40 and the heat dissipation member 80. Moreover, the heat conductive material 81 that is spread to the outside of the metal substrate 40 fills the periphery of the metal substrate 40. This leads to an increase in air tightness of the periphery of the metal substrate 40, inhibiting bubbles and the like from being mixed therein and preventing the deterioration of the heat dissipation. Heat dissipation of the semiconductor device 10 to which the heat dissipation member 80 is installed in this manner can be improved.

Second Embodiment

In the second embodiment, the semiconductor device of the first embodiment is described with more specific examples.

FIG. 2A is a plan view showing the back of a semiconductor device 100 (the side to which a heat dissipation fin is installed), FIG. 2B a cross-sectional diagram of the semiconductor device 100, taken along a dashed line X-X of FIG. 2A, and FIG. 2C a cross-sectional diagram of the semiconductor device 100, taken along a dashed line Y-Y of FIG. 2A.

The semiconductor device 100 has a plurality of semiconductor elements 200, a circuit board 300 on which the plurality of semiconductor elements 200 are placed, and an aluminum base substrate 400 placed on the circuit board 300.

The circuit board 300 is configured by an insulating substrate 310 and a circuit layer 320 on the insulating substrate 310, which is a circuit pattern formed from a metal foil piece made of copper or the like. The semiconductor device 100 also has a resin case 500 (i.e. storage member) having a storage region 510 with a concave principal surface 511 and an opening 540 and having external terminals 560 formed above the storage region 510. The principal surface 511 of the resin case 500 is depressed inward into the shape of a funnel or a ball. Note that illustration of the external terminals 560 is omitted in FIG. 2C. The resin case 500 is composed of, for example, glass-reinforced epoxy resin or PPS (polyphenylene sulfide) resin. In addition, screw holes 530 are formed between a rim portion 520 of the resin case 500 and the opening 540. The screw holes 530 are formed facing each other with the opening 540 therebetween. The diameter of the screw holes 530 is greater than that of screws 700. It is desired that each screw hole 530 be shaped into a rectangle or an oval that is elongated in the direction connecting the two screw holes 530 (the direction of the dashed line X-X). The number of the screw holes 530 does not have to be two; thus, three or more of the screw holes 530 may be formed, if need be. In this resin case 500, the circuit board 300 is stored in the storage region 510 with the base substrate 400 positioned downward in the diagram. The semiconductor elements 200 and the circuit layer 320 on the circuit board 300 stored as described above are electrically connected to the external terminals 560 of the resin case 500 by aluminum wires 210 and sealed with sealing resin 550. Soft gel-type resin, for example, can be used as the sealing resin 550. When using gel-type resin as the sealing resin 550, a lid with high hardness such as epoxy resin should be used to cover the gel-type resin. When sealing with the sealing resin 550, resin with high hardness such as epoxy resin can be casted.

Note that the base substrate 400 has a shape that is pointed downward in the diagram (into the shape of a mound), with its bottom portion (apex portion) being convexed downward, as shown in FIGS. 2B and 2C. For this reason, the level of the apex portion of the base substrate 400 is set in such a manner that the apex portion is accommodated completely in the concave storage region 510 of the resin case 500.

Figure 3A:
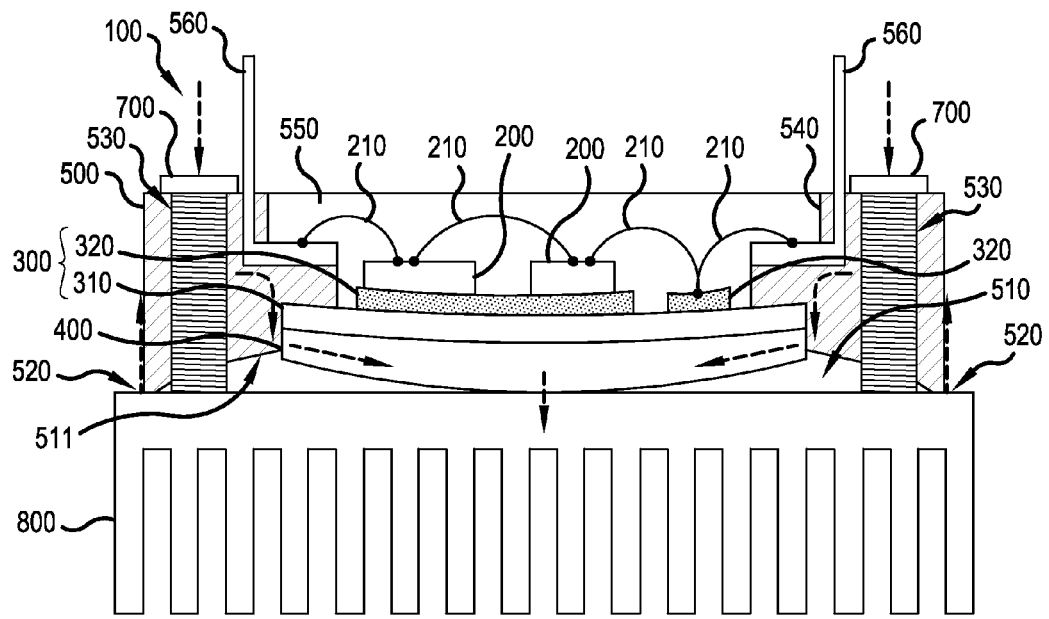
FIGS. 3A and 3B are diagrams for explaining a method for installing a heat dissipation fin to the semiconductor device according to the second embodiment.
Figure 3B:
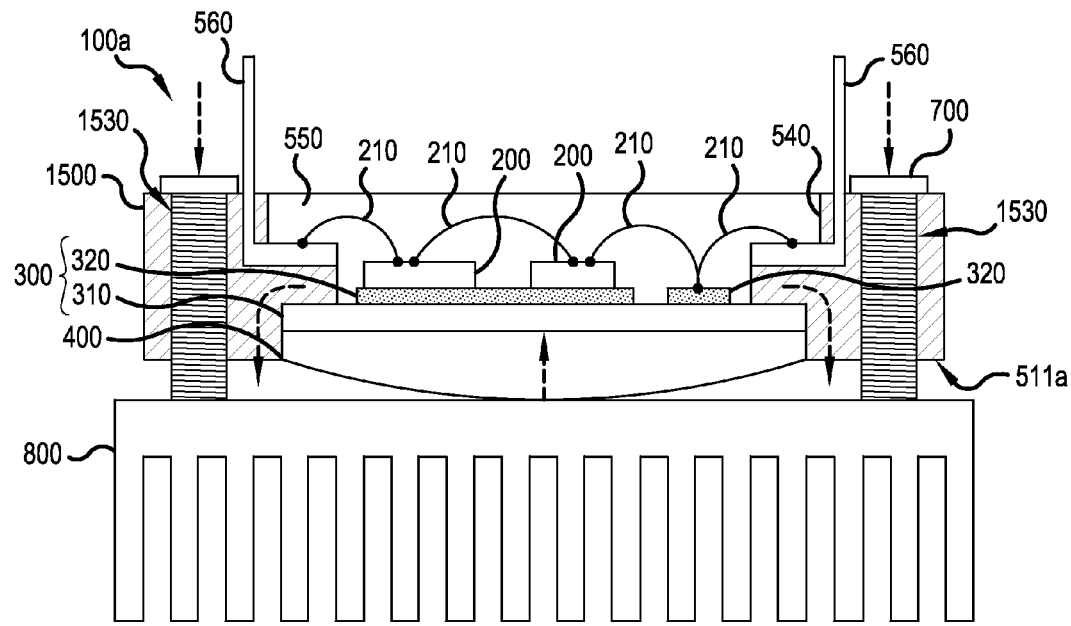

A method for installing a heat dissipation fin 800 to such a semiconductor device 100 is now described with reference to FIGS. 3A and 3B. FIGS. 3A and 3B are diagrams for explaining a method for installing a heat dissipation fin to the semiconductor device according to the second embodiment.

Note that FIG. 3A shows how the heat dissipation fin 800 is installed to the semiconductor device 100 according to the second embodiment, while FIG. 3B shows how the heat dissipation fin 800 is installed to a semiconductor device 100a. Illustration of a heat conductive material to be disposed between the base substrate 400 and the heat dissipation fin 800 is omitted in FIGS. 3A and 3B.

First of all, a predetermined amount of heat conductive grease (not shown) is disposed as the heat conductive material at substantially the central region on the fixing side of the semiconductor device 100 near the heat dissipation fin 800, and then the semiconductor device 100 is placed on the heat dissipation fin 800 in such a manner that the base substrate 400 faces the heat conductive grease.

The screws 700 are inserted into the screw holes 530 of the resin case 500 of the semiconductor device 100 and screwed to the heat dissipation fin 800, to fasten the semiconductor device 100 to the heat dissipation fin 800 (FIG. 3A).

In so doing, in the semiconductor device 100, when a force that is directed downward in the diagram is applied by the screws 700 screwed to the heat dissipation fin 800, the force acts on the center of the base substrate 400, with the rim portion 520 of the storage region 510 supporting the heat dissipation fin 800 as a fulcrum. Consequently, a force that is directed downward in the diagram acts from the base substrate 400 onto the heat dissipation fin 800.

In addition, due to the downwardly-convexed shape of the bottom portion (apex portion) of the base substrate 400 of the semiconductor device 100, the heat conductive grease (in the vicinity of the center thereof) between the base substrate 400 and the heat dissipation fin 800 can be applied with pressure greater than that applied to the periphery. Therefore, the thickness of the heat conductive grease corresponding to the region below the center of the base substrate 400 can be further reduced, and the heat conductive grease can be spread outward. Owing to the rim portion 520 of the storage region 510, the spread heat conductive grease can fill up the storage region 510 without leaking to the outside of the storage region 510 and fill the periphery of the base substrate 400.

When fastening the semiconductor device 100 to the heat dissipation fin 800 using the screws 700, because the diameter of the screw holes 530 is greater than that of the screws 700, the screws 700 can reliably be screwed to the heat dissipation fin 800 even when the target positions for the screws 700 on the heat dissipation fin 800 are misaligned.

For comparison of the installation of the heat dissipation fin 800 to the semiconductor device 100, FIG. 3B is now used to explain a method for installing the heat dissipation fin to a semiconductor device in which the principal surface 511 of the resin case is not in the concave shape.

The semiconductor device 100a is configured by providing the circuit board 300 of the semiconductor device 100 to a resin case 1500 that has one of principal surfaces 511a formed flat instead of concave, as shown in FIG. 3B.

As with the configuration of the semiconductor device 100, the screws 700 are passed through screw holes 1530 of the resin case 1500 to fasten the heat dissipation fin 800 to the semiconductor device 100a. In this case, while the semiconductor device 100a receives from the screws 700 a force directed downward in the diagram, the base substrate 400 receives from the heat dissipation fin 800 a force directed upward in the diagram. In the semiconductor device 100a, therefore, a force that is directed downward in the diagram acts more on the peripheral portion of the base substrate 400 than on the center of the same.

For this reason, the pressure that can be applied in a downward direction in the diagram to the heat dissipation fin 800 is greater in the semiconductor device 100 than the semiconductor device 100a. Thus, in the semiconductor device 100, a large pressure can be applied to the heat conductive grease below the base substrate 400, and the heat conductive grease can be spread into a thin layer between the base substrate 400 and the heat dissipation fin 800.

Such a semiconductor device 100 described above has a semiconductor element 200, a circuit board 300 having the semiconductor element 200 placed on one of its principal surfaces (the upper side of the diagram), a base substrate 400 placed on the other principal surface of the circuit board 300 (the lower side of the diagram), and a resin case 500 having a storage region 510 with a concave principal surface 511 and an opening 540 and having screw holes 530. In the semiconductor device 100, the circuit board 300 is stored in the storage region 510 of the resin case 500 with the base substrate 400 protruding from the concave principal surface 511, and the stored circuit board 300 (the other principal surface thereof (the upper side of the diagram)) is sealed together with the semiconductor element 200 with sealing resin 550. The base substrate 400 and the heat dissipation fin 800 are fixed to each other with the heat conductive grease therebetween, and the screw members 700 are inserted into the screw holes 530 of the resin case 500 and screwed to the heat dissipation fin 800, to fasten the semiconductor device 100 to the heat dissipation fin 800.

By fastening the semiconductor device 100 to the heat dissipation fin 800 as described above, a force from the resin case 500 is applied to the center of the base substrate 400 in the semiconductor device 100, with the rim portion 520 of the storage region 510 as a fulcrum, and a force that is directed downward in the diagram acts from the convex base substrate 400 onto the heat dissipation fin 800. As a result, the heat conductive grease can be spread into a thin layer between the base substrate 400 and the heat dissipation fin 800, improving the heat dissipation between the base substrate 400 and the heat dissipation fin 800. Moreover, the heat conductive grease that is spread outside the base substrate 400 fills the periphery of the base substrate 400. This leads to an increase in air tightness of the periphery of the base substrate 400, inhibiting bubbles and the like from being mixed therein and preventing the deterioration of the heat dissipation. Heat dissipation of the semiconductor device 100 to which the heat dissipation fin 800 is installed in this manner can be improved.

In addition, shaping the screw holes 530 into a rectangle or an oval can easily make the directions of the force from the resin case 500 to the base substrate 400 in line with each other. A method for producing this semiconductor device 100 is described next with reference to FIGS. 4A-D.

Figure 4A:
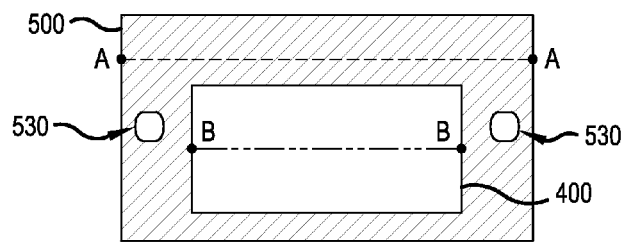
FIGS. 4A, 4B, 4C, and 4D are diagrams for explaining a method for producing the semiconductor device according to the second embodiment.
Figure 4B:
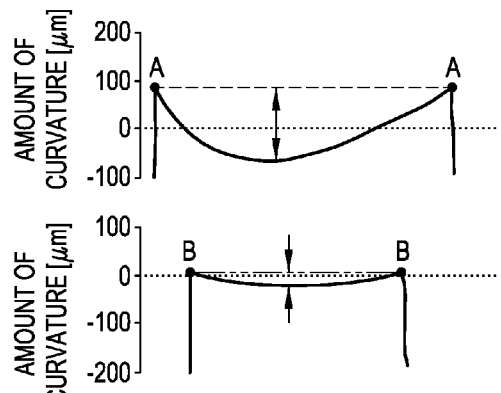
Figure 4C:
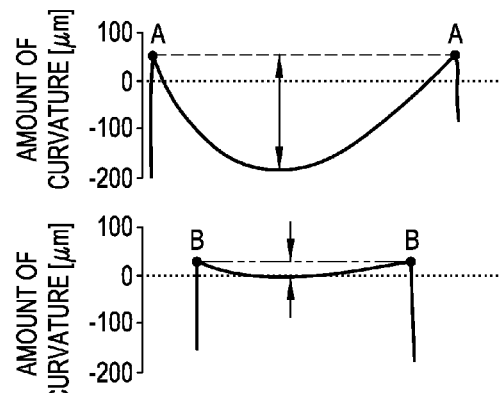
Figure 4D:
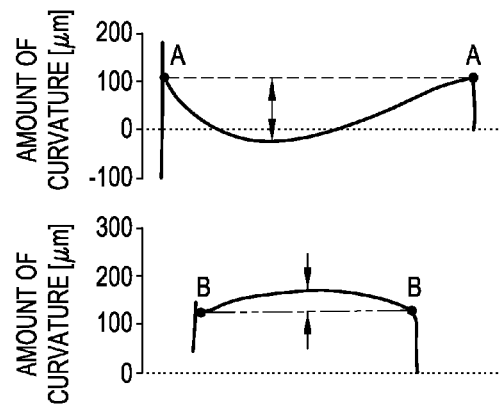

FIGS. 4A-D are diagrams for explaining a method for producing the semiconductor device according to the second embodiment. Note that FIG. 4A is a plan view showing the back of the semiconductor device 100 (the side to which the heat dissipation fin 800 is installed). FIGS. 4B to 4D each show the amount of curvature of the resin case 500 of FIG. 4A at a broken line A-A (upper graphs) and the amount of curvature of the base substrate 400 at a two-dot chain line B-B (lower graphs), which are obtained during the production steps. In each of FIGS. 4B to 4D, the vertical axes represent the amounts of curvature [μm], and the horizontal axes the portions of the resin case 500 along the broken line A-A and the base substrate 400 along the broken line B-B.

First, prepared is a resin case 500 measuring approximately 43 mm in width by 26 mm in height by 3.6 mm in thickness, which has screw holes 530 placed at an interval of 36 mm and has already been curved to have a concave principal surface. Next prepared is a circuit board 300 (not shown) measuring approximately 30 mm in width by 13 mm in height, on which is placed a base substrate 400, also curved beforehand, and to which a semiconductor element 200 is soldered as, for example, a switching element (not shown). The resin case 500 and the circuit board 300 prepared in this manner are combined. In so doing, the base substrate 400 is placed to face the outside toward the storage region 510 of the resin case 500 (to the side where the heat dissipation fin 800 is placed).

In this case, as shown in FIG. 4B, the maximum amount of curvature of the concave resin case 500 (the amount shown by the arrow in the upper graph) is approximately 153 μm, and the base substrate 400 is also curved in the same direction as the resin case 500 and has the maximum amount of curvature (the amount shown by the arrow in the lower graph) of approximately 23 μm.

Subsequently, the circuit board 300 and the resin case 500 that are installed in this manner are bonded to each other with an adhesive. Note that epoxy resin, silicone resin or the like can be used as the adhesive. In this case, as shown in FIG. 4C, the maximum amount of curvature of the resin case 500 is approximately 235 μm, and the base substrate 400 is also curved in the same direction as the resin case 500 and has the maximum amount of curvature of approximately 30 μm.

The circuit board 300 that is stored in and adhered to the storage region 510 of the resin case 500 as described above is sealed together with the semiconductor element 200 and an aluminum wire 210 with sealing resin 550 (see FIG. 2B, for example). The maximum amount of curvature of the resin case 500 at this moment is approximately 126 μm, as shown in FIG. 4D. The base substrate 400, on the other hand, is pressed by the sealing resin 550 against the side to which the heat dissipation fin 800 is installed, is thereby curved in the direction opposite to the direction in which the resin case 500 is curved, and has an amount of curvature of approximately 45 μm.

The semiconductor device 100 can easily be produced in which the resin case 500 and the base substrate 400 that are curved in the same direction beforehand are curved in a desired direction during the production steps.

In the foregoing method for producing the semiconductor device 100, the resin case 500 and the base substrate 400 that are already curved beforehand are provided with desired curvature in the production steps. In addition to such process, it is also possible to form a concave storage region in the resin case 500 and to form the base substrate 400 into a convex shape, and then the resultant base substrate 400 can be placed on the resultant resin case 500 to produce the semiconductor device 100.

Figure 5A:
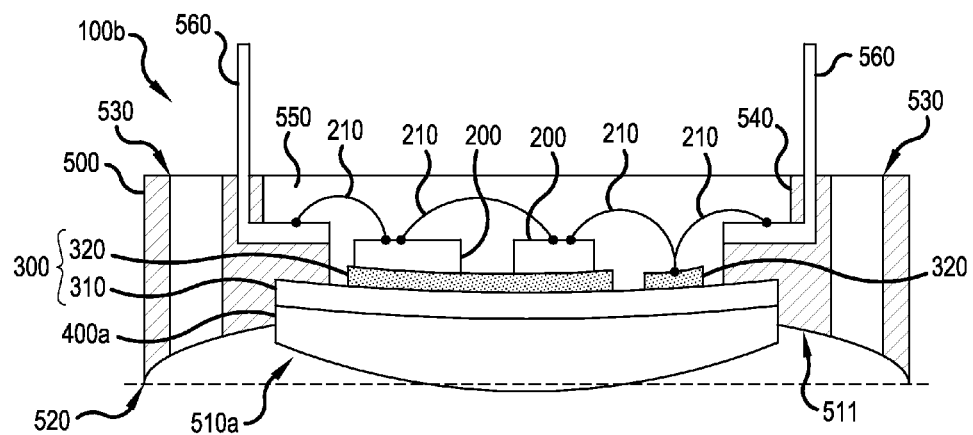
FIGS. 5A and 5B are diagrams for explaining another semiconductor device according to the second embodiment.
Figure 5B:
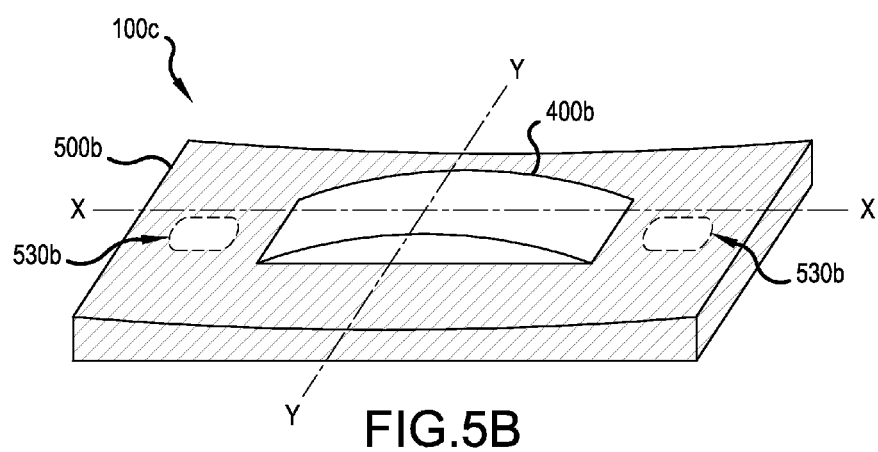

Next, various aspects of the semiconductor device are described with reference to FIGS. 5A and 5B. FIGS. 5A and 5B are diagrams for explaining another semiconductor device according to the second embodiment. Note that FIG. 5A is a cross-sectional diagram of a semiconductor device 100b. A base substrate 400a is the only difference between the semiconductor device 100b and the semiconductor device 100, as shown in FIG. 5A, but the rest of the configuration is the same as that of the semiconductor device 100. FIG. 5B schematically shows the back of a resin case 500b of the semiconductor device 100c, taken along dashed lines X-X, Y-Y corresponding to those shown in FIG. 2A.

In the semiconductor device 100, the level of the apex portion of the base substrate 400 is set in such a manner that the apex portion is accommodated completely in the concave storage region 510 of the resin case 500, as described above. In the semiconductor device 100b, on the other hand, the base substrate 400a is not completely accommodated in the storage region 510a of the resin case 500, but the level of the apex portion of the base substrate 400a is set such that the apex portion protrudes by approximately several μm from the storage region 510a.

As a result of configuring the base substrate 400a into this size, the apex portion of the base substrate 400a presses the heat conductive grease at the time when the semiconductor device 100b is placed on the heat dissipation fin 800, with the heat conductive grease therebetween. Thereafter, when fastening the semiconductor device 100b to the heat dissipation fin 800 using the screws 700, the heat conductive grease is constantly pressed by the apex portion of the base substrate 400a and then stably spreads into a thin layer.

Due to the configuration of the base substrate 400a in which the apex portion thereof protrudes by approximately several μm from the storage region 510a, the heat conductive grease can stably be spread into a thin layer by fastening the semiconductor device 100b to the heat dissipation fin 800.

Although the base substrate 400 of the semiconductor device 100 is convexed into a mound shape, the base substrate 400 does not have to be shaped into a mound as long as it is convexed. Thus, as shown in FIG. 5B, for example, the cross section taken along the dashed line X-X may be in a U-shape, and the cross section taken along the dashed line Y-Y may be in a rectangular shape (so-called semi-cylindrical shape).

Screw holes 530b in this case may be shaped into a rectangle or an oval that is elongated in the direction of the dashed line X-X. Note that FIG. 5B shows rectangular screw holes 530b. When fastening the heat dissipation fin 800 to the semiconductor device 100c, there is a possibility that the heat dissipation fin 800 moves along an outer surface of the base substrate 400b. Shaping the screw holes 530b into rectangles, therefore, can securely screw the screws 700 to the moving heat dissipation fin 800. For instance, the basic shape of the screw holes 530b is a circle with a diameter of 3.5 mm, which is greater than the diameter of the screws 700 by approximately 0.5 mm, so that the heat dissipation fin 800 can be fastened, the screws 700 having a dimensional tolerance of approximately ±0.3 mm and being of M3 standard. Moreover, in view of the pitch difference of approximately ±0.3 mm between the screw holes 530b, it is preferred that the screw holes 530b be shaped into an oval that is wider by approximately ±0.5 mm in the pitch direction.

In the situation shown in FIGS. 5A-B as well, in the semiconductor devices 100b, 100c fastened to the heat dissipation fin 800 with the screws 700, the force directed downward in the diagram acts downward from the convex base substrates 400a, 400b onto the heat dissipation fin 800, with the rim portion 520 of the storage regions 510, 510a as a fulcrum with respect to the heat dissipation fin 800, as with the embodiments described above. As a result, the heat conductive grease can be spread into a thinner layer between each of the base substrates 400a, 400b and the heat dissipation fin 800, improving the heat dissipation between each of the base substrates 400a, 400b and the heat dissipation fin 800. In addition, the heat conductive grease spread to the outside of the base substrates 400a, 400b fills the peripheries of the base substrates 400a, 400b. This leads to an increase in air tightness of the peripheries of the base substrates 400a, 400b, inhibiting bubbles and the like from being mixed therein and preventing the deterioration of the heat dissipation. The heat dissipation of each of the semiconductor devices 100b, 100c to which the heat dissipation fin 800 is installed in this manner can be improved.

It should be noted that the embodiments described above are to illustrate the specific examples of the present invention. Therefore, the present invention should not be construed as being limited to these embodiments, and various modifications can be made to the present invention without departing from the gist thereof. For example, a circuit layer formed from a metal foil piece (not shown) may be formed on either side of the insulating substrate 310 of the circuit board 300, wherein a semiconductor element 200 may be bonded to one of the circuit layers, and a metal substrate may be bonded to the other circuit layer.

The above description merely illustrates the principles of the present invention. A person skilled in the art can make various modifications and changes; thus, the present invention is not limited to the precise configurations and applications illustrated and described above. Therefore, all suitable modifications and equivalents are deemed to fall within the scope of the present invention defined by the appended claims and equivalents thereof.

The invention claimed is:

1. A semiconductor device comprising:
a circuit board;
a semiconductor element disposed on a first side of the circuit board;
a metal substrate disposed on a second side of the circuit board;
a storage member having a storage region, a concave principal surface, an opening in which the circuit board is disposed with the metal substrate protruding from the concave principal surface, and fastener holes in the concave principal surface and configured to allow passage of fasteners; and
a heat dissipation member coupled to the storage member via fasteners disposed in the fastener holes such that a first end of the concave principal surface directly contacts the heat dissipation member, a second end of the concave principal surface directly contacts the metal substrate and is spaced apart from the heat dissipation member, and a distance between the metal substrate and the heat dissipation member is less than a distance between the second end of the concave principal surface and the heat dissipation member,
wherein the concave principal surface is configured only by a flat surface or a curved surface and is in direct contact with the metal substrate.

2. The semiconductor device according to claim 1, wherein the concave principal surface is formed in such a manner that a portion of the storage region outside the fastener holes protrudes in a direction away from the circuit board.

3. The semiconductor device according to claim 2, wherein the fastener holes face each other with the metal substrate therebetween.

4. The semiconductor device according to claim 1, wherein the metal substrate has a convex surface that protrudes in a direction away from the circuit board.

5. The semiconductor device according to claim 4, wherein the metal substrate has a mound shape.

6. The semiconductor device according to claim 4, wherein the metal substrate has a semi-cylindrical shape.

7. The semiconductor device according to claim 6, wherein the fastener holes have an oval or rectangular shape in a radial direction and are formed as a pair such that major axes thereof are in line with each other with the metal substrate therebetween.

8. The semiconductor device according to claim 1, wherein the circuit board is sealed together with the semiconductor element by a resin.

9. The semiconductor device according to claim 1, further comprising:
a heat conducting material disposed between the heat dissipation member and the metal substrate.

10. The semiconductor device according to claim 9, wherein the metal substrate protrudes toward the heat dissipation member.

11. The semiconductor device according to claim 1, wherein distal end points of the storage member protrude in a direction away from the circuit board, and the metal substrate protrudes beyond the distal end points.

12. The semiconductor device according to claim 1, wherein distal end points of the storage member protrude in a direction away from the circuit board, and the distal end points protrudes beyond the metal substrate.

13. A method for installing a heat dissipation member to a semiconductor device having a semiconductor element,
the semiconductor device comprising:
a circuit board;
a semiconductor element disposed on a first side of the circuit board;
a metal substrate disposed on a second side of the circuit board; and
a storage member having a storage region, a concave principal surface, an opening in which the circuit board is disposed with the metal substrate protruding from the concave
principal surface, and fastener holes in the concave principal surface and configured to allow passage of fasteners,
the method comprising:
arranging a heat dissipation member and the storage member with a heat conductive material therebetween so that the heat dissipation member faces the metal substrate;
inserting the fasteners into the fastener holes; and
coupling the heat dissipation member and the storage member using the fasteners such that a first end of the concave principal surface directly contacts the heat dissipation member, a second end of the concave principal surface directly contacts the metal substrate and is spaced apart from the heat dissipation member, and a distance between the metal substrate and the heat dissipation member is less than a distance between the second end of the concave principal surface and the heat dissipation member,
wherein the concave principal surface is configured only by a flat surface or a curved surface and is in direct contact with the metal substrate.

14. A semiconductor device configured to be disposed on a heat dissipation member, comprising:
a semiconductor element;
a circuit board including a first side on which the semiconductor element is disposed;
a metal substrate disposed on a second side of the circuit board;
a storage member having,
a concave principal surface,
an opening disposed within the concave principal surface, the opening accommodating the circuit board with the metal substrate protruding from the concave principal surface, and
fastener holes disposed in the concave principal surface, the fastener holes being configured to allow passage of the fasteners for fastening the metal substrate to the heat dissipation member disposed facing the metal substrate,
wherein the side surface of the metal substrate is in direct contact with the inside of the concave principal surface, and a rim portion of the concave principal surface protrudes in the same direction as the metal substrate, and
wherein the concave principal surface is configured only by a flat surface or a curved surface and is in direct contact with the metal substrate.

15. The semiconductor device according to claim 14, wherein the rim portion is disposed outside of the fastener holes.

16. The semiconductor device according to claim 15, wherein the end of the rim portion protrudes.

17. The semiconductor device according to claim 14, wherein the storage member further includes a principal surface facing the concave principal surface, and the concave principal surface is inclined with respect to the principal surface of the storage member.

18. The semiconductor device according to claim 17, wherein the concave principal surface is configured only by the flat surface.

19. The semiconductor device according to claim 17, wherein the concave principal surface is configured only by the curved surface.

20. A semiconductor device configured to be disposed on a heat dissipation member, comprising:
a semiconductor element;
a circuit board including a first side on which the semiconductor element is disposed;
a metal substrate disposed on a second side of the circuit board;
a storage member having,
a concave principal surface,
an opening disposed within the concave principal surface, the opening accommodating the circuit board with the metal substrate protruding from the concave principal surface, and
fastener holes disposed in the concave principal surface, the fastener holes being configured to allow passage of the fasteners for fastening the metal substrate to the heat dissipation member disposed facing the metal substrate,
wherein the side surface of the metal substrate is in direct contact with the inside of the concave principal surface, and a rim portion of the concave principal surface protrudes in the same direction as the metal substrate,
wherein the storage member further includes a principal surface facing the concave principal surface, and the concave principal surface is inclined with respect to the principal surface of the storage member,
wherein the concave principal surface is configured by a flat surface or a curved surface, and
wherein the axes of the fastener holes are substantially perpendicular to the concave principal surface.

* * * * *